(12) United States Patent
Robinson et al.

(10) Patent No.: US 6,873,280 B2
(45) Date of Patent: Mar. 29, 2005

(54) CONVERSION EMPLOYING DELTA-SIGMA MODULATION

(75) Inventors: Ian Stuart Robinson, Venice, CA (US); Jeffrey Mark Hinrichs, San Diego, CA (US); Kenneth Weber, Redondo Beach, CA (US); Jasmine Upendra Patel, Torrance, CA (US); Paul Charles MacFalda, Redondo Beach, CA (US); William Marvin Skones, Manhattan Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/459,750

(22) Filed: Jun. 12, 2003

(65) Prior Publication Data

US 2004/0252038 A1 Dec. 16, 2004

(51) Int. Cl.[7] .............................................. H03M 1/36
(52) U.S. Cl. ...................... 341/159; 341/144; 341/143
(58) Field of Search ................................ 341/159, 143, 341/141, 126, 155, 156, 144, 145

(56) References Cited

U.S. PATENT DOCUMENTS

| | | | |
|---|---|---|---|
| 5,196,852 A | | 3/1993 | Galton |
| 5,521,946 A | * | 5/1996 | Main ........................ 375/350 |
| 5,768,316 A | | 6/1998 | Sogo |
| 6,154,161 A | * | 11/2000 | Leme et al. ................ 341/143 |
| 6,177,893 B1 | * | 1/2001 | Velazquez et al. ......... 341/118 |
| 6,275,836 B1 | * | 8/2001 | Lu ............................. 708/313 |
| 6,362,762 B1 | | 3/2002 | Jensen et al. |
| 6,437,718 B1 | | 8/2002 | Oyama et al. |
| 6,437,719 B1 | | 8/2002 | Noro et al. |
| 6,438,434 B1 | | 8/2002 | Kamiya |
| 6,441,761 B1 | * | 8/2002 | Viswanathan ............... 341/144 |
| 6,473,013 B1 | * | 10/2002 | Velazquez et al. ......... 341/120 |
| 6,480,129 B1 | | 11/2002 | Melanson |
| 6,489,908 B2 | * | 12/2002 | Panasik et al. ............. 341/144 |
| 6,498,535 B1 | | 12/2002 | Allen et al. |
| 6,515,605 B2 | * | 2/2003 | Panasik et al. ............. 341/143 |
| 6,518,905 B2 | * | 2/2003 | Siferd ........................ 341/143 |
| 6,525,682 B2 | * | 2/2003 | Yap et al. ................... 341/137 |
| 2002/0163454 A1 | | 11/2002 | Yap et al. |
| 2003/0112165 A1 | | 6/2003 | Al-Awadhi |
| 2003/0128143 A1 | * | 7/2003 | Yap et al. ................... 341/143 |

FOREIGN PATENT DOCUMENTS

EP 1 011 200 A1 6/2000

OTHER PUBLICATIONS

US 6,496,127, 12/2002, Olson et al. (withdrawn)
Yunfeng Liang, and Yong Lian, "A 250MHz CMOS Bandpass Delta Sigma Modulator Using Continuous–Time Resonator Structure (Short Paper)", (date unknown).
Sean Chuang, et al.; XP–000869318 *"Design and Implementation of Bandpass Delta–Sigma Modulators Using Half–Delay Integrators"* IEEE Transactions on Circuits and Systems–II: Analog and Digital Signal Processing, vol. 45 No. 5 May 1998.
European Search Report for EP 03 02 5703 Completed Jun. 1, 2004 by Examiner A. Brosa Gonzalez.

* cited by examiner

*Primary Examiner*—Michael Tokar
*Assistant Examiner*—John B Nguyen
(74) *Attorney, Agent, or Firm*—Tarolli, Sundheim, Covell & Tummino L.L.P.

(57) ABSTRACT

Signal conversion of an input signal can be achieved by processing portions of the signal through plural parallel paths, which collectively approximate a desired infinite impulse response (IIR) filter, either alone or implemented with other signal processing functions. In one aspect, each of the paths can perform filtering, noise-shaping and/or quantization on a respective portion of the input signal to provide a corresponding representation of the respective portion of the input signal, for example, a coarser representation at a higher data rate. The corresponding representations from the parallel paths can be aggregated and further processed in a desired manner, such as conversion to an analog signal.

31 Claims, 9 Drawing Sheets

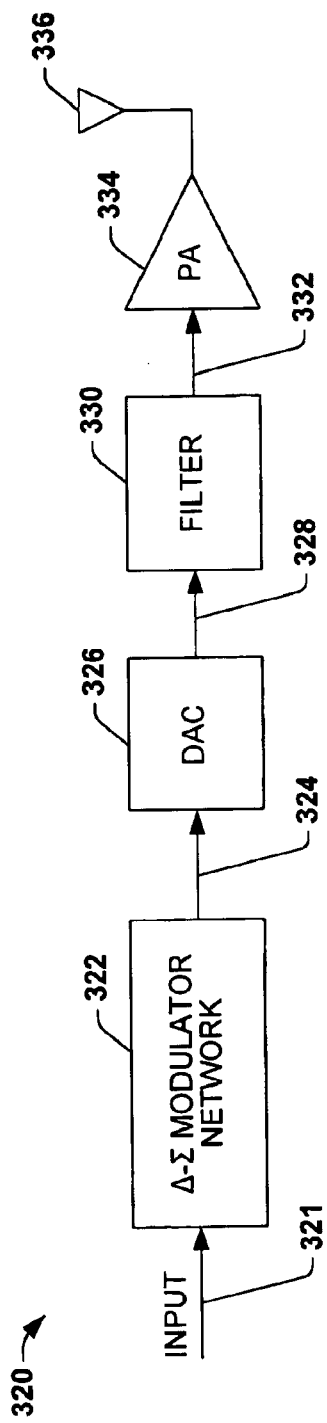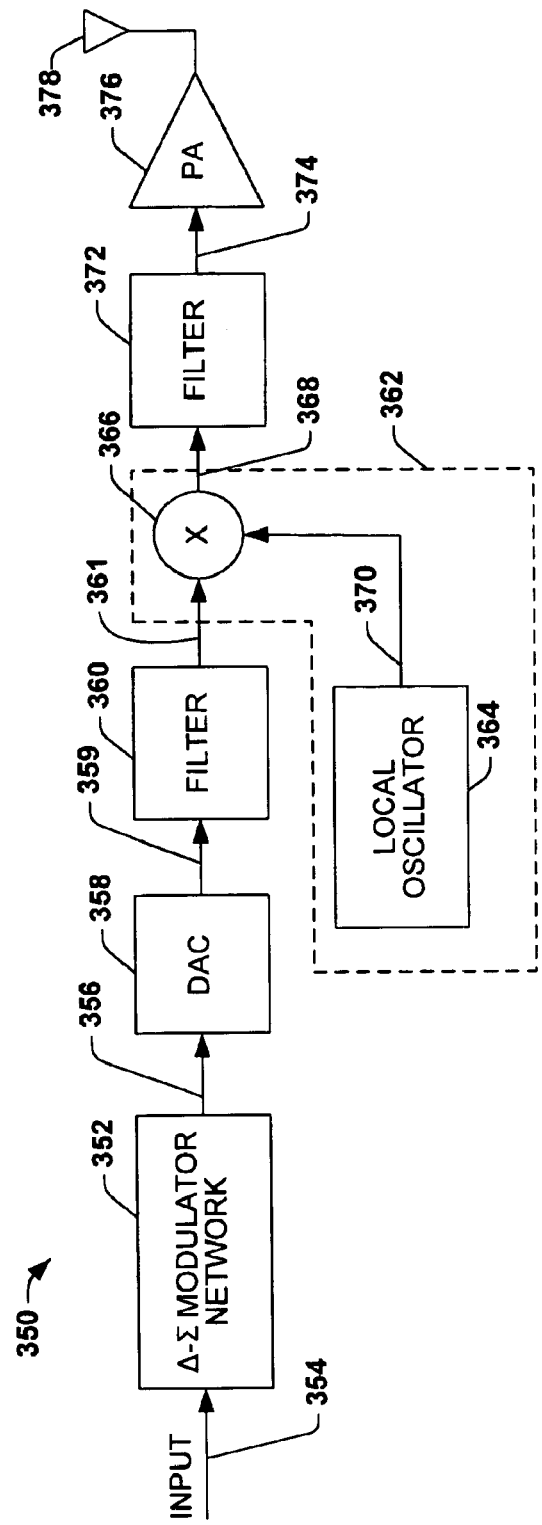

CONVERSION EMPLOYING DELTA-SIGMA MODULATION

TECHNICAL FIELD

The present invention relates generally to signal processing, and more particularly to a system and method for signal conversion employing delta-sigma modulation.

BACKGROUND OF THE INVENTION

Efforts in the design of integrated circuits for radio frequency (RF) communication systems generally focus on improving performance, reducing cost or a combination thereof. One area of increasing interest relates to conversion of signals, such as from analog-to-digital, digital-to-analog or digital-to-digital. These types of conversion have benefited from the development and use of delta-sigma modulation.

Delta-sigma modulation is a technique used to generate a coarse estimate of a signal using a small number of quantization levels and a high sampling rate. Limiting a signal to a finite number of levels introduces "quantization noise" into the system. The effect of oversampling and the use of an integrator feedback-loop in delta-sigma modulation are effective in shifting noise, including quantization noise, to out-of-band frequencies. The noise shifting properties enables efficient use of subsequent filtering stages to remove noise and produce a more precise representation of the input.

In order to achieve increasing efficiency and precision in delta-sigma modulation, a delta-sigma modulator often must be operated at high sampling rates. For example, faster modulators can be fabricated using more expensive technologies, such as Silicon Germanium (SiGe) or Indium Phosphide (InP). These semiconductor technologies, however, tend to have limits in chip, size, number of transistors and/or are not cost effective in many applications due to their low yields and/or higher material costs For wireless commercial applications, in particular, there is a need for a low cost converter having a high dynamic range and wide bandwidth.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates generally to systems and methods to facilitate conversion of a digital signal to another form, which can be an analog representation or a different digital representation thereof. In one implementation, such conversion approximates a delta-sigma modulator by employing parallel stages of delta-sigma modulators (DSM). The core of a delta-sigma modulator is an infinite impulse response (IIR) filter. The present invention can be utilized with recursive signal processing chains, including IIR filters, that are not contained within a DSM.

In another implementation, such conversion can approximate other circuitry containing or utilizing an IIR filter or an IIR filter itself by employing parallel stages, each stage including an IIR filter.

According to one aspect of the present invention, an input signal is separated and respective portions thereof are provided to corresponding parallel paths. Each path includes a DSM stage operative to convert a respective portion of the input signal to a less precise (e.g., fewer bits) representation thereof. For example, the DSM performs the conversion in each path by employing delta-sigma modulation and digital upconversion providing a low-bit (e.g., one-bit or multi-bit) output at an increased data rate relative to the rate of the input signal.

Each parallel path can operate at a lower speed (e.g., nominally 1/N for N parallel stages) than a single path system. The outputs from the parallel paths can be stored in a rate buffer, multiplexed and read out at a high speed to provide a corresponding aggregate representation of the input signal. The aggregate representation can be further processed or converted, such as by digital-to-analog conversion thereof. For example, a high-speed digital-to-analog converter having a desired level of precision can be employed, which can be a one-bit DAC or multi-bit DAC. Advantageously, needing only one or a few bits, a high-speed DAC can be employed to provide a corresponding analog output directly at a desired transmission frequency (e.g., radio frequencies, microwave frequencies and so forth) without requiring additional upconversion or mixing. The parallel system can be efficiently implemented to approximate a high-speed IIR filter or DSM by using low-speed, low-cost technologies (e.g., CMOS) obtainable with conventional ASIC technology. More expensive technologies also can be utilized in this manner to achiever even greater performance.

For wireless applications, systems and methods according to an aspect of the present invention can provide wide bandwidth, high dynamic range, and linearity for multi-carrier transmit modules for various wireless system standards.

In the event that the approximation of the full speed system implemented in accordance with an aspect of the present invention results in an output signal having an unacceptable error or glitch, appropriate hardware and/or software can be employed to correct the signal. For example, an indication of the glitch can be derived and utilized (e.g., by inversion) to substantially cancel the corresponding glitch in the output signal. The glitch cancellation can be performed in the analog domain, digital domain or a combination thereof.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

BRIEF DESCRIPTION OF THE DRAWINGS

FIG. 8 is a block diagram depicting part of a communications system incorporating a conversion system in accordance with an aspect of the present invention.

FIG. 9 is a block diagram depicting part of another communications system incorporating a conversion system in accordance with an aspect of the present invention.

DETAILED DESCRIPTION OF INVENTION

The present invention relates generally to signal conversion in which an input signal is processed through plural parallel paths, which collectively approximate a desired infinite impulse response filter, which can be implemented independently or in combination with other signal processing functions (e.g., quantization). For example, at least two of the paths can be operative to perform delta-sigma modulation on respective sample portions of the input signal to provide corresponding quantized representations of these sample portions of the input signal. The corresponding quantized representations from the parallel paths can be aggregated and converted to an analog signal at a desired frequency. According to an aspect of the present invention, the conversion system can be employed to provide a low cost, high performance digital-to-analog converter. This approach further enables wide bandwidth, high dynamic range and linearity for multi-carrier communications systems.

Figure 1:
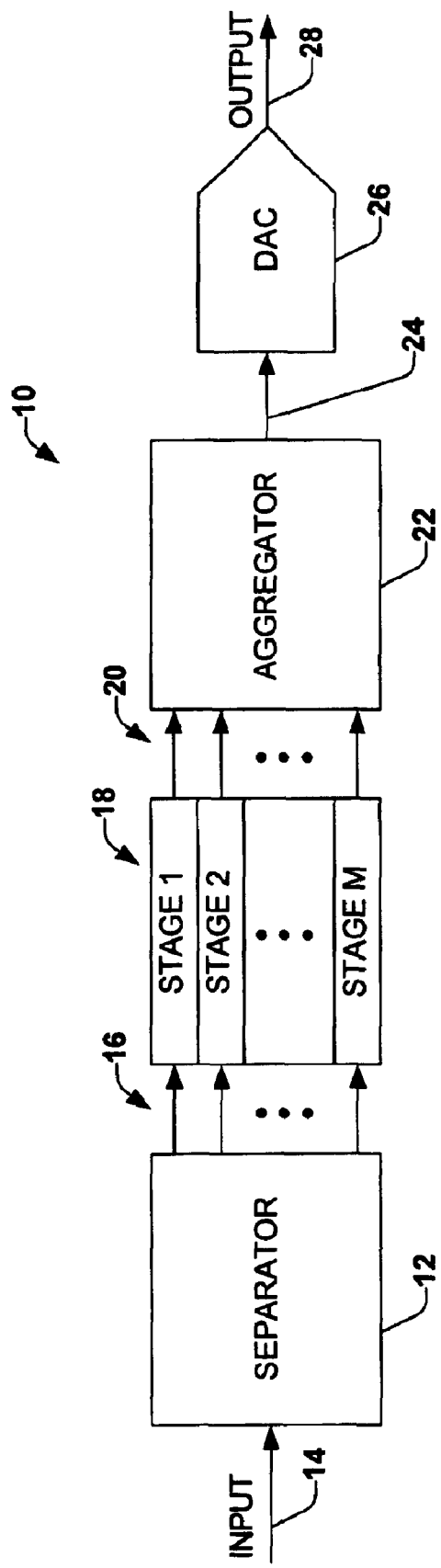
FIG. 1 is a schematic block diagram depicting a conversion system implemented in accordance with an aspect of the present invention.

FIG. 1 schematically depicts a conversion system 10 that can be implemented in accordance with an aspect of the present invention. The system 10 includes a separator 12 that is operative to sample segments or bursts (for example, from the Global System for Mobile Communications (GSM), or other time division multiple access (TDMA) communications systems) from an input signal 14. The input signal 14, for example, is a digital signal, such as can be provided from a baseband modulator or Digital Signal Processor (not shown) at an input sample rate.

The separator 12 provides each of the respective signal segments 16 to a network 18 that includes an arrangement of M stages (where M≧2). For example, each stage in the network 18 includes one or more infinite impulse response (IIR) filters. The parallel arrangement of stages can be employed to approximate a higher speed signal path, including an IIR filter, according to an aspect of the present invention. In one particular example, the network 18 includes M parallel delta-sigma modulator stages, each of which includes an IIR filter. The particular number M of parallel stages in the network 18 depends at least in part on the application for which the system 10 is to be utilized and desired system performance. The separator 12 can route respective signal segments 16 to the network 18 by appropriate switching (e.g., demultiplexing, rate buffering, etc.) of the signal segments from the input signal 14. In this way, M sample segments 16 of the input signal 14 can be processed in parallel by the network 18, with each stage running at a lower speed (e.g. 1/M the input sample rate) than would be required for a comparable single stage filter.

For example, the separator 12 can provide sequential sample segments 16 to different stages of the network 18 according to a clock signal (not shown) that defines the input sample rate. When the separator 12 provides a sample segment 16 to the last (e.g., $M^{th}$) parallel stage in the network 18, the separator can be reset to provide the next M samples to a predetermined sequence of the parallel stages of the network. The respective signal segments can be sampled as any number of bits, which may vary depending on the input sample rate and multiple access or multiplexing scheme being utilized. For example, the signal segments can be a burst or a portion of a burst (e.g., for time-division multiple access), a frequency subband or portion thereof (e.g., for frequency division multiple access), a channel or subchannel (e.g., for code division multiple access) and the like.

The network 18 receives each of respective sample segments 16 at slower data rates than that of the input signal 14. The down conversion of the sample rate can be achieved, for example, by buffering each of the sample segments in suitable memory and controlling each of the parallel stages of the network 18 to sample the segments from the memory at the lower rate. A desired sample rate for the respective segments 16 can be provided, for example, by reading each of the respective signal segments into a selected parallel stage of the filter network 18 at 1/M the sample rate of the input signal.

By way of example, each of the stages (stage 1 through stage M) in the network 18 can be implemented as a digital delta-sigma modulator operative to perform digital-to-digital conversion. That is, each stage converts a respective signal segment having a predetermined number of bits to a coarser (e.g., lower bit) digital representation. Each stage can include a digital interpolation or upconverter such that the respective output 20 is provided at faster data rate than the input 16. The conversion by each stage includes quantization and noise shaping, as is known in the art. It will be appreciated that because a parallel arrangement of two or more delta-sigma modulators is utilized in the network 18, each of the delta-sigma modulators can be implemented as low speed (e.g., inexpensive CMOS) delta-sigma modulators to collectively approximate a higher speed delta-sigma modulator according to an aspect of the present invention. The parallel stage network 18 provides the equivalent oversample ratio (OSR, the ratio of DSM clock rate to twice the input signal bandwidth) of the higher speed single stage system. It can be appreciated that the dynamic range and bandwidth achievable by a DSM is dependent on its OSR. Alternatively, more expensive (e.g., SiGe or InP) delta-sigma modulators can be utilized for the stages 18 to achieve even higher performance in accordance with an aspect of the present invention.

Each delta-sigma modulator in the network 18 provides quantized data 20 to an aggregator at a desired rate. For example, the quantized data 20 can be provided to the aggregator 22 at approximately 1/M the desired output sample rate, which can be capable of providing the output at a desired output sample rate. The quantized data 20 can be one-bit data stream or multi-bit data stream, for example, having a low number of bits (e.g., about 8 or less).

The aggregator 22 is operative to buffer and multiplex the quantized data 20 from each parallel stage of the network 18 at the desired sample rate, which, for example, is M times the rate at which each stage provides the quantized data 20 to the aggregator. The aggregator 22 thus provides an aggregate quantized output signal 24, such as to a digital-to-analog converter (DAC) 26. The DAC 26 converts the quantized output signal 24 to a corresponding analog signal 28. The aggregator 22 and DAC 26 both operate at the desired output sample rate. It will be appreciated that a DSM approximated by the network 18 and aggregator 22 can provide coarser resolution data at 24, which can be provided to other digital signal processing stages reducing the bit-widths, as well as associated costs and/or complexities of those stages.

For example, the DAC 26 can be implemented as a high speed one-bit or multi-bit DAC (e.g., formed of a material capable of operating at high sample rates, such as SiGe or InP). It will be understood and appreciated that a high speed one-bit DAC helps ensure high linearity and low spur levels in the analog output signal 28. Because such a one-bit DAC can operate at high speeds, the system 10 is particularly useful for wireless RF applications. For example, the DAC 26 can provide the analog output signal 28 directly at a desired transmission frequency (e.g., RF, such as Ultra High Frequencies (UHF), or microwave frequencies) so that no additional analog upconversion or mixing is required prior to transmission (e.g., over a wireless or wired medium). Alternatively, simplified single stage upconversion and mixing can be utilized in situations where higher frequencies may be desired. At least a portion of the aggregator (e.g., the multiplexing portion) 22 also can be implemented using the same high-speed technology as the DAC 26.

Figure 2:
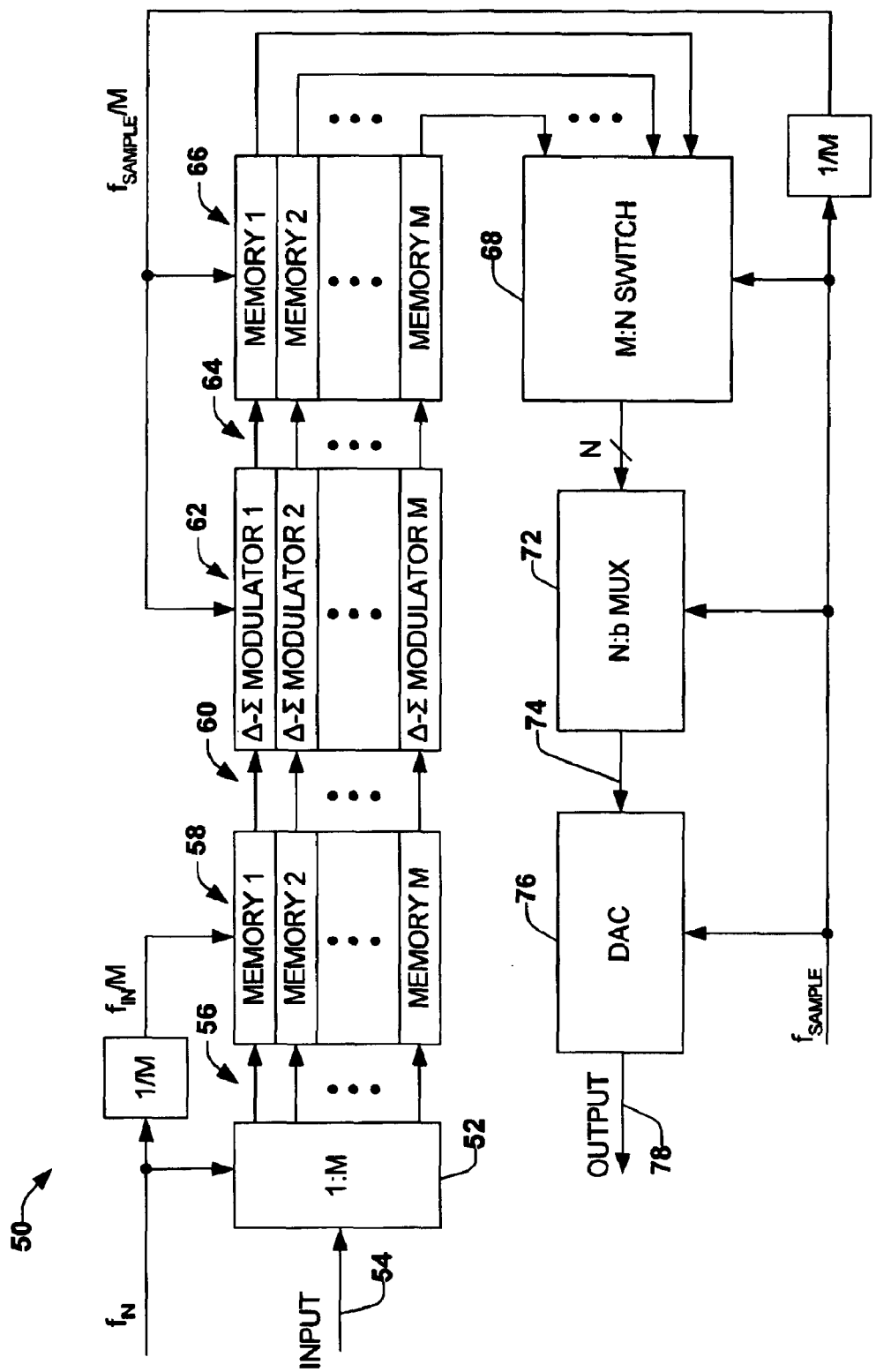
FIG. 2 is a schematic block diagram depicting a delta-sigma conversion system implemented in accordance with an aspect of the present invention.

FIG. 2 is a block diagram illustrating an example of a delta-sigma modulator DAC system 50 that can be implemented in accordance with an aspect of the present invention. In this example, the system 50 includes a switching system 52, such as a de-multiplexer, that receives a digital input signal 54. A baseband modulator or DSP (not shown) can provide the input signal 54 according to a desired communications protocol, for example, which can be a multi-carrier or multiple access scheme (e.g., global system for mobile communications (GSM), Enhanced Data Rates for GSM Evolution (EDGE), wideband code division multiple access (WCDMA), orthogonal frequency division multiplexing (OFDM) frequency division multiple access (FDMA) and the like).

The switching system 52 separates (e.g., samples) portions of the input signal into M respective data segments 56 having a predetermined number of bits that are provided to an associated memory system 58. The number of bits for each data segment 56 can vary according to, among other things, the type of multiple access scheme, the rate of the digital input signal and based on the number M of parallel paths. For the example of GSM, which uses time-division multiple access (TDMA), the switching system 52 can read in one burst (148 symbols) of data to each stage of memory, 1 to M.

The memory system 58 includes memory buffers (e.g., M memory sections) sufficient to store the respective data segments 56 from the switching system 52. The memory system 58 operates as parallel rate buffers to facilitate down conversion of the input signal 54 from an input data rate. A parallel delta-sigma modulator network 62 reads buffered data segments 60 from the memory system 58 at a lower data rate than the sample rate of the input signal 54. For example, where the input signal 54 is sampled at a rate of $f_{IN}$, the rate for each of the parallel delta-sigma modulators to sample the respective buffered segments 60 is $f_{IN}/M$.

The network 62 includes M delta-sigma modulators arranged in parallel, (indicated as $\Delta\Sigma$ MODULATOR 1 through $\Delta\Sigma$ MODULATOR M). Each of the delta-sigma modulators processes the input data segments 60 by performing a noise shaping function and quantization. Each of the delta-sigma modulators 62 provides quantized digital representation of a respective buffered data segment, indicated at 64, that is stored in buffer memory 66. The DSM may include an interpolator or digital upconverter, in which case the output will be at higher rate than the input. For example, each of the parallel stages of delta-sigma modulators 62 can provide a respective one-bit stream of quantized data 64 into the buffer memory 66 at a desired sample rate, which can be higher than the sample rate of the input signal 54. The output sample rate of the quantized data 64 can be selected to be functionally related to a desired high-speed sample rate $f_{SAMPLE}$, such as inversely proportional to the number of parallel stages, namely $f_{SAMPLE}/M$.

Those skilled in the art will understand and appreciate that the parallel arrangement of delta-sigma modulators 62 operating at slower, more conventional speeds provides an acceptable approximation of a high speed delta-sigma modulator in accordance with an aspect of the present invention. Because such an approximation can be implemented using conventional CMOS technology and achieve comparable performance to that provided by high speed, more expensive technology, a significant cost savings can be achieved according to an aspect of the present invention. The cost savings is realized because, even though additional hardware may be needed to construct the network 62 than a comparable high speed alternative, CMOS is much less expensive to employ and has a substantially higher yield. Alternatively, higher cost and faster technologies, such as SiGe and InP, can also be utilized to provide the parallel delta-sigma modulator network and, thereby achieve even higher sample rates.

It will be understood and appreciated that any number M of parallel delta-sigma modulator stages can be utilized in accordance with an aspect of the present invention. The number of stages for a given application will generally result from a balancing of the clock rates for the stages relative to the amount of hardware for the modulator network and the required size of the memory buffer 58. The penalty for adding stages is there is a short amount of latency introduced to the signal chain associated with each additional stage.

For wireless applications, those skilled in the art will understand and appreciate that delta-sigma modulation generally requires high clock rates (e.g., greater than 900 MHz) to process large signal bandwidths. In some circumstances, however, it may become prohibitively expensive to run a delta-sigma modulator sufficiently fast, for example, due to higher cost and lower yields associated with high-speed technologies, such as SiGe and InP. By employing a parallel arrangement of lower speed (e.g., CMOS) delta-sigma modulators to approximate a higher-speed delta-sigma modulator, the present invention provides a low cost solution to improve overall performance in the delta-sigma modulator DAC system 50 that can be implemented using readily available and accepted CMOS technology. By way of example, simulations for GSM and EDGE modulated data streams have shown that 8 or 16 stages of parallel delta-sigma modulators using low cost technology can achieve comparable performance relative to a single stage, high cost (e.g., SiGe or InP) delta-sigma modulator.

Referring back to FIG. 2, the memory 66 includes M memory sections, each receiving quantized data 64 from a respective one of the parallel delta-sigma modulators 62. It will be appreciated that fewer than M memory sections alternatively could be utilized by enabling selected delta-sigma modulators to share memory sections. However, those skilled in the art will appreciate that, where the delta-sigma modulators 62 and memory 66 are fabricated using low cost technology (e.g., CMOS), the incremental cost associated with providing additional CMOS memory locations or other CMOS structures is sufficiently low to warrant their use.

A M:N switch system 68, such a multiplexer, is clocked to read the quantized data from the memory buffer 66 and provide a corresponding N-bit wide bitstream 70, where N is a positive integer greater than or equal to one. The switch system 68, for example, cycles through the M buffer sections in a predetermined order to provide the N-bit wide bitstream. That is, the output of the memory buffer 66 can be provided to a high speed multiplexer 72. It will be appreciated that N can be chosen to fit available memory device formats and speeds.

The multiplexer 72 converts the N-bit input to a b-bit output 74 with a desired, coarser bit width (e.g., one-bit or other number of b bits, where b is a positive integer b<N) at the desired sample rate $f_{SAMPLE}$. The sample rate $f_{SAMPLE}$ can be any rate greater than the Nyquist rate (twice the signal bandwidth). It is not uncommon to set $f_{sample}$ to be proportional to the center frequency $f_{CENTER}$ of a desired signal. The multiplexer 72 provides the one-bit or few-bit output 74 to a DAC 76. Thus, the number of bits b in the output at 74 is selected to correspond to the number of bits that the DAC is designed to convert to the analog domain.

To achieve RF or IF (e.g., IF<RF) frequencies, the multiplexer 72 and DAC 76, for example, can be implemented using high-speed technology (e.g., SiGe or InP) operating at the desired sample rate $f_{SAMPLE}$. It will be understood and appreciated that instead of employing both multiplexers 68 and 72, a single multiplexer operating at the desired sample rate could be utilized to multiplex the quantized data from the buffer memory 66 to provide the one-bit output 74 to the DAC 76.

By way of example, the DAC 76 can be a high speed one-bit DAC, such as can be implemented using the same high speed technology as the multiplexer 72 (e.g., SiGe or InP). The DAC 76 and multiplexer 72 run at the desired sample rate $f_{SAMPLE}$. The DAC 76 converts the one-bit baseband signal 74 to a corresponding analog output signal 78 having a predetermined center frequency (e.g., $f_{CENTER} \Box f_{SAMPLE}/4$). In accordance with an aspect of the present invention, the DAC 76 can run at a sample clock rate to produce the output signal 78 directly at desired transmission frequencies (e.g., UHF or microwave frequencies) without requiring analog mixers or frequency upconversion. Continuing with the above GSM example, $f_{SAMPLE}$ can be about 3.77 GHz, such that the DAC 76 provides the analog output signal 78 centered at about 940 MHz. Alternatively, the parallel delta-sigma modulator network 62 in conjunction with the high-speed DAC 76 facilitates upconversion to desired frequencies using a single stage for such upconversion.

Additionally, conventional approaches to DACs tend to focus on providing a high dynamic range over a large spectrum. In contrast, the approach described herein appreciates that certain types of communications systems (e.g., wireless or cellular) may not require a high dynamic range for the entire spectrum. Thus, a delta-sigma modulator DAC implemented according to an aspect of the present invention is well suited to provide a high dynamic range for a desired portion of the spectrum. By focusing on improved performance for a portion of the spectrum, the system 50 can substantially reduce costs of wireless devices, which typically require a modest amount of spectrum (e.g., from about 5 to about 75 MHz).

Figure 3:
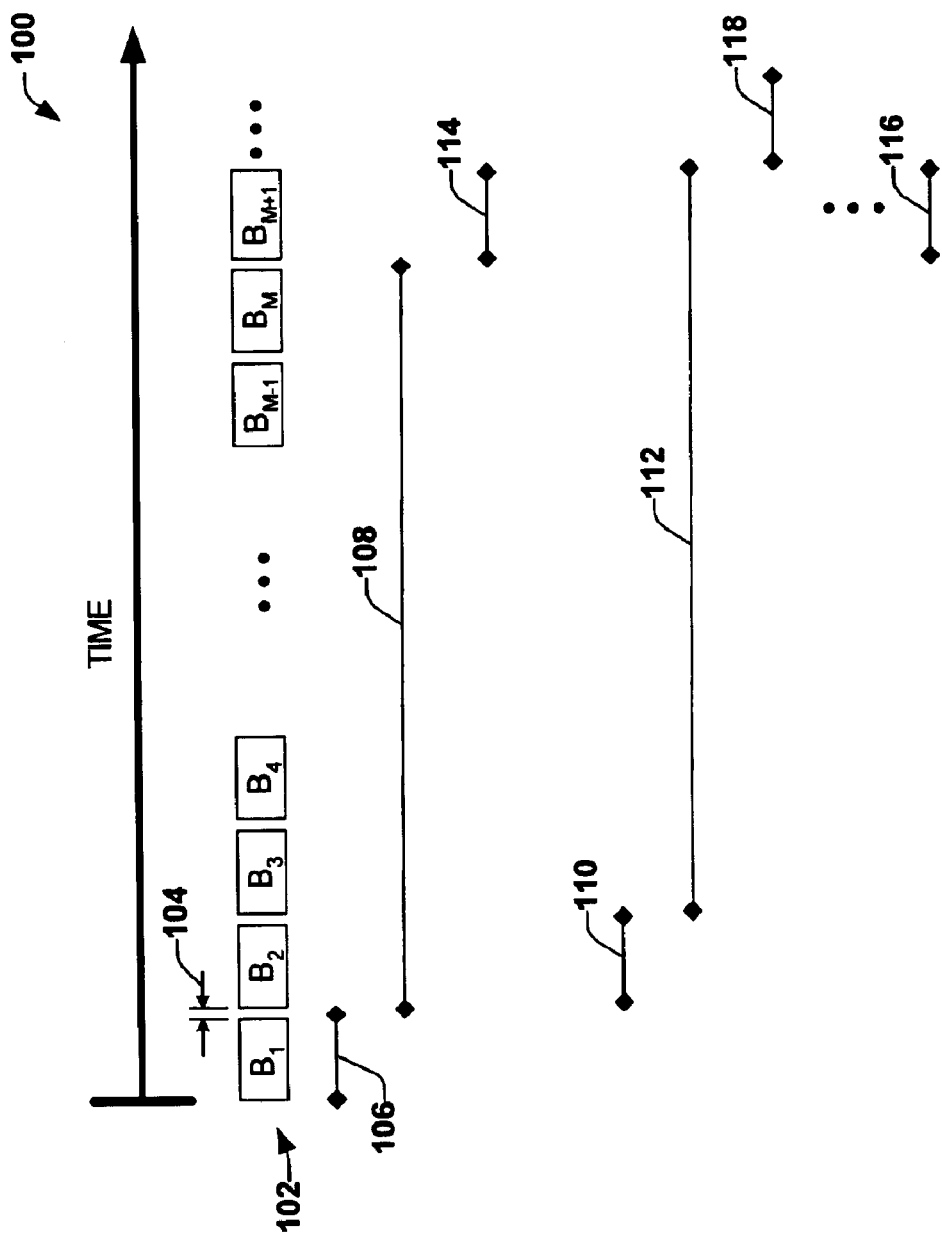
FIG. 3 depicts part of a time sequence depicting how data can be converted in accordance with an aspect of the present invention.

FIG. 3 illustrates an example of a possible time sequence 100 for processing of digital data using a conversion system according to an aspect of the present invention. For purposes of illustration and not by way of limitation, the example in FIG. 3 will be described in the context of GSM TDMA baseband data signal 102 (e.g., corresponding to the input signal 54 of FIG. 2). The GSM TDMA signal 102 includes time slots or bursts, each of which may be assigned to an active mobile user in a wireless communications network. A normal transmission burst occupies an associated time slot, which typically includes message data on each side of a training sequence. A guard band 104 separates bursts from each other.

In the example of FIG. 3, for purposes of the following description, the bursts in the illustrated time period have been numbered from $B_1$ to $B_{M+1}$, where M corresponds to the number of parallel delta-sigma modulation stages in the conversion system. As described herein, M is at least two.

Burst $B_1$ of the input signal 102 is read into an appropriate rate buffer memory, as indicated at 106. Each burst can be read sequentially as the input signal 102 is received. This can be accomplished by appropriately switching or demultiplexing data from each respective burst into an associated buffer memory. While for simplification of explanation a burst can be buffered into memory, it will be understood and appreciated that different predetermined size portions of the input signal 102 could also be processed in accordance with an aspect of the present invention.

After the burst $B_1$ has been stored in the rate buffer, a delta-sigma modulator associated with that rate buffer memory section processes the burst accordingly, indicated at 108. The processing during 108 includes noise shaping and quantization to provide a coarsely quantized (e.g. one-bit) output. It will be appreciated that the clock rate for the delta-sigma modulation is a function of the total number of M parallel stages. For example, the delta-sigma modulator operates at 1/M the input sample rate and provides an upconverted output at 1/M a desired output sample rate.

After reading the burst $B_1$ into rate buffer memory (at 106), a next burst $B_2$ is sequentially read into its respective rate buffer memory, as indicated at 110. The burst $B_2$ is then processed by another respective one of the parallel delta-sigma modulators, as indicated at 112. In this way, M bursts can be sequentially read and processed in parallel to provide respective quantized (e.g., one-bit) outputs at 1/M the desired clock rate.

After delta-sigma modulation of burst $B_1$ (at 108), at 114, the quantized output for such burst is read from an associated output buffer and appropriately multiplexed into a DAC. Commensurate with burst $B_1$ being read from the output rate buffer and converted to analog (at 114), at 116, burst $B_{M+1}$ is read into the same rate buffer memory into which burst $B_1$ was read during the previous cycle (at 106). Thus, the cycle can repeat for every M bursts of input data. Following reading and converting the quantized burst $B_1$ to analog (at 114), burst $B_2$ is sequentially read from buffer memory, multiplexed into the DAC to provide the analog output, as indicated at 118. The analog output can be appropriately filtered (e.g., by a surface acoustic wave (SAW) bandpass filter) to provide the analog output at a desired frequency.

Figure 4:
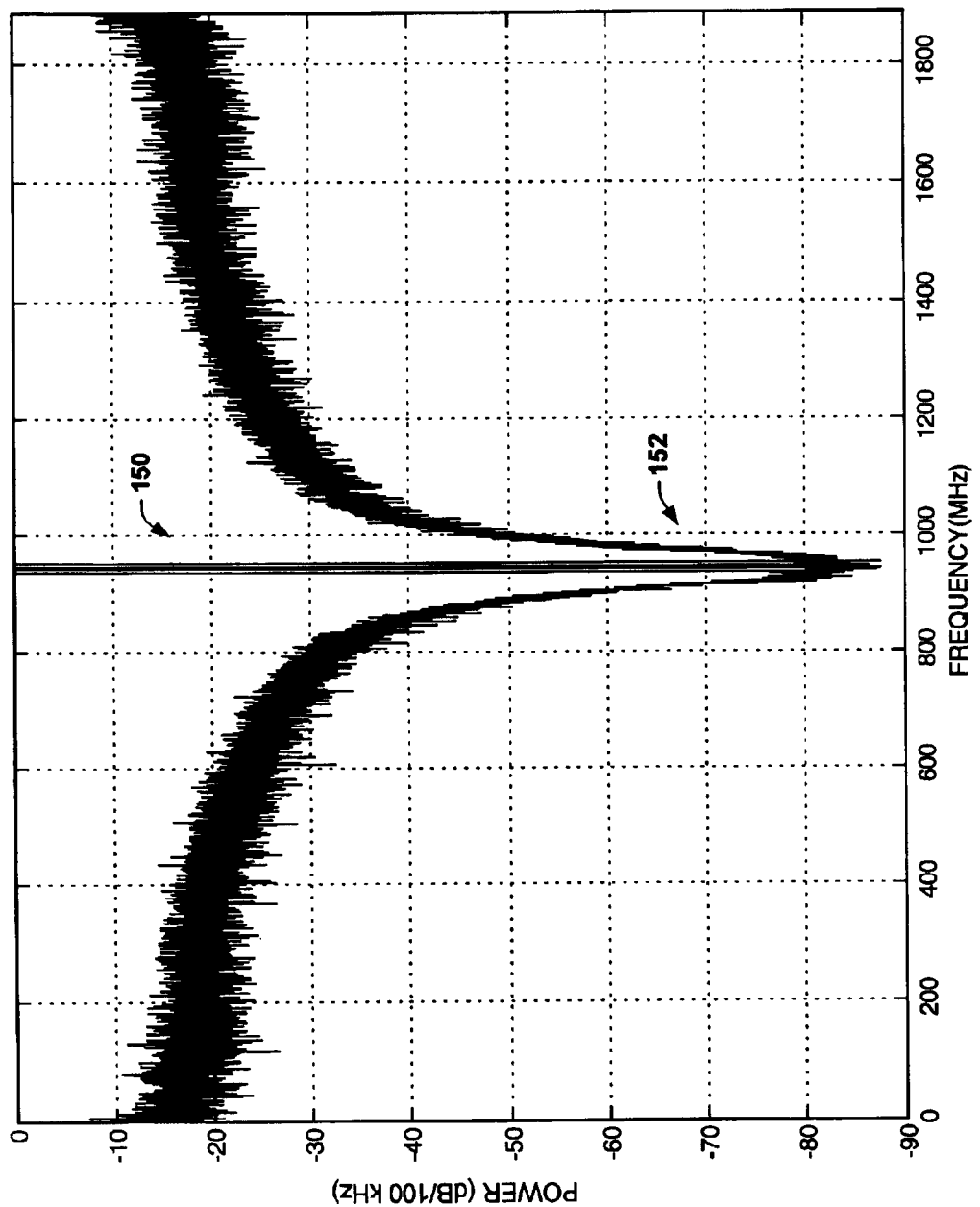
FIG. 4 is a graph illustrating an example of a signal provided by a conversion system in accordance with an aspect of the present invention.

FIG. 4 is a graph of an analog output signal 150 in which power (dB/100 kHz) is plotted as a function of frequency (MHz) for the analog output of a delta-sigma DAC implemented in accordance with an aspect of the present invention. As mentioned above, a delta-sigma DAC according to an aspect of the present invention can provide a very low noise region 152 of the spectrum, which is particularly useful for wireless communications applications. Operating in a GSM band, for this example, the analog signal 150 is centered at about 940 MHz and includes a low noise region 152 extending around the center frequency (e.g., about 30 to about 100 MHz).

Figure 5:
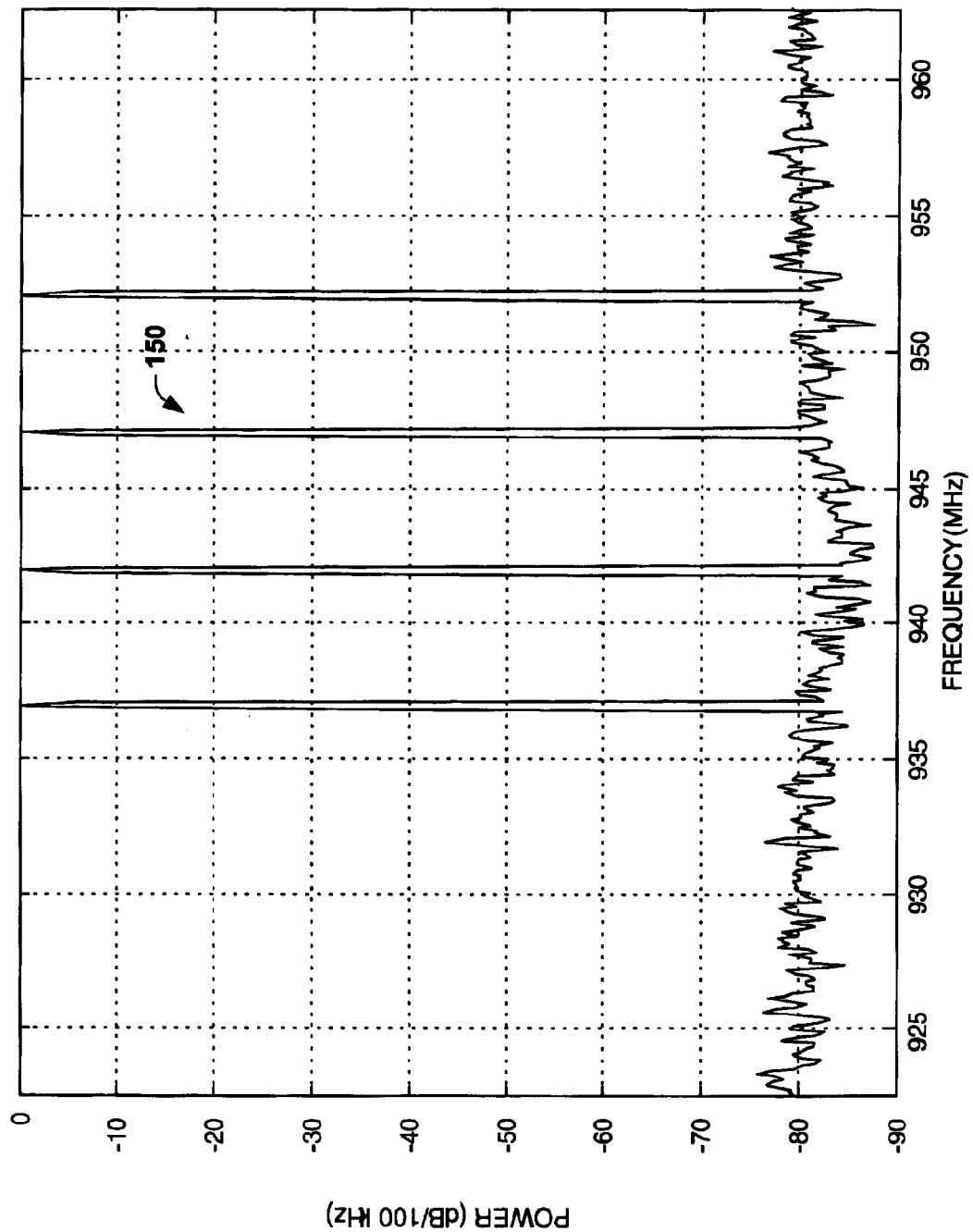
FIG. 5 is a graph illustrating a portion of the signal of FIG. 4.

FIG. 5 shows an enlarged view of the signal 150 for part of the low noise region, namely from about 925 MHz to about 960 MHz. It will be appreciated that by running the DAC at about four times a center frequency (e.g., about 940 MHz), quantized data can be read from rate buffers and transformed directly to wireless transmission frequencies (e.g., UHF or microwave frequencies) without requiring analog frequency upconversion or mixing. Such an approach further enables simplified upconversion and mixing where even higher frequencies are desired.

By approximating a delta-sigma IIR filter using plural delta-sigma IIR filters in parallel, according to an aspect of the present invention, a glitch or error can occur as an error component in the analog output signal. The error component, for example, results from the registers in each filter stage containing unique values because each stage has processed different data. The error, if any, occurs at the transitions between parallel stages. The error appears as a very short impulsive signal.

In many applications, the error is not important. For example, in GSM TDMA, there is a "dead" time between processing of each time slot assigned to a given active mobile user. The error occurs between useful segments of data transmitted in the TDMA bursts, such as during "dead" time (e.g., in the training sequence), such that data integrity is not compromised. Additionally, the error is small (e.g., 40 dB or more below the wanted signal levels) and thus is within system tolerances for many applications.

Figure 6:
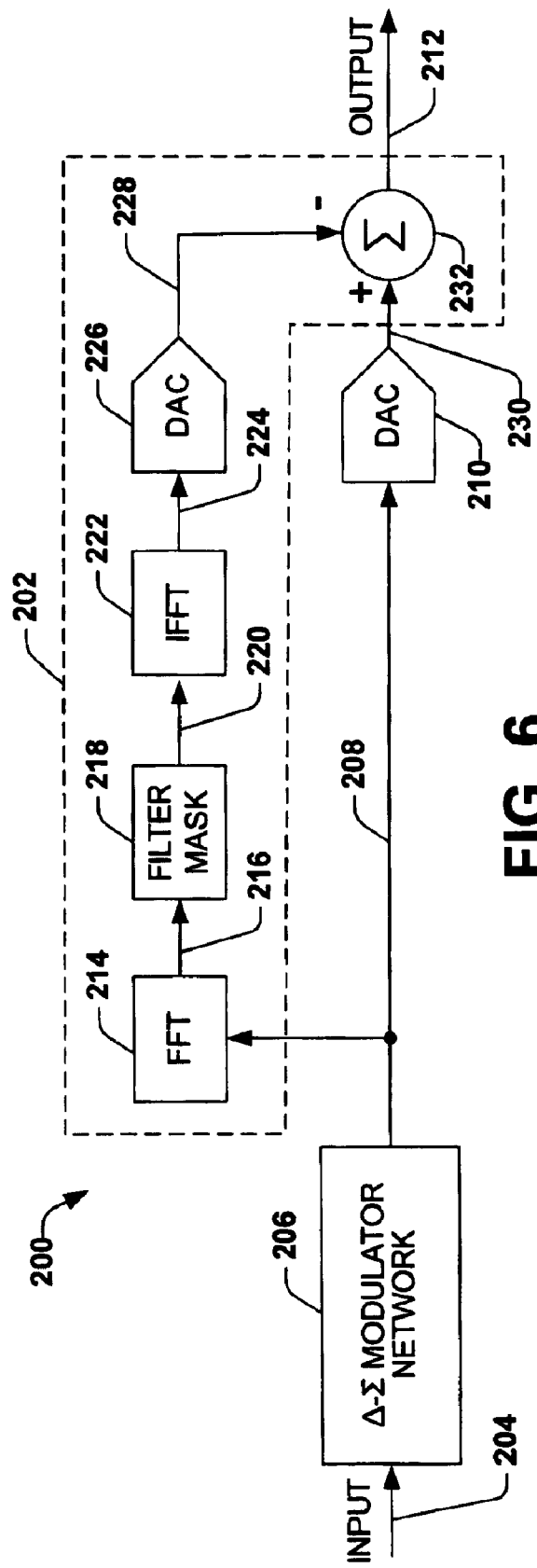
FIG. 6 is a block diagram depicting a conversion system implemented with a first type of de-glitch system in accordance with an aspect of the present invention.
Figure 7:
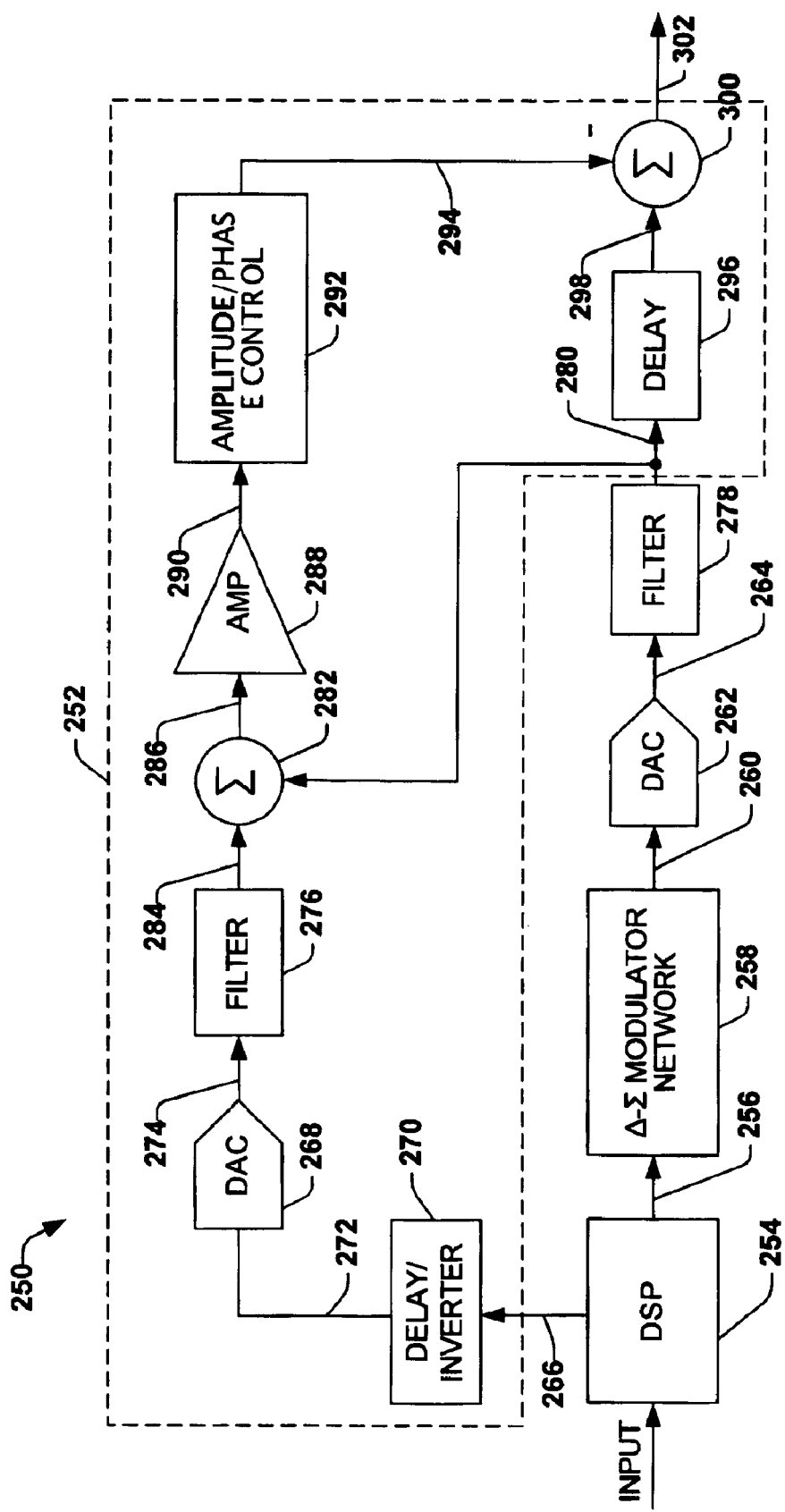
FIG. 7 is a block diagram depicting a conversion system implemented with a second type of de-glitch system in accordance with an aspect of the present invention.

For applications where either there is not a "dead" time, as there is in TDMA systems, or the error simply is unacceptable, a parallel network can employ a cancellation system in accordance with an aspect of the present invention. FIGS. 6 and 7 depict examples of different types of cancellation systems that can be utilized to substantially reduce such error components in accordance with an aspect of the present invention. Those skilled in the art may conceive other configurations and arrangements that can be utilized to reduce error in a delta-sigma modulator DAC according to an aspect of the present invention, all of which are contemplated as falling within the scope of the present invention.

FIG. 6 illustrates an example of a delta-sigma modulator DAC system 200 that includes a deglitching system 202 in accordance with an aspect of the present invention. A baseband input signal 204 is provided to a delta-sigma modulator network 206 having two or more parallel delta-sigma modulation stages, such as shown and described herein. The network 206 provides a stream of quantized data 208 to an associated DAC 210. As mentioned above, the quantized data stream 208 can be a one-bit stream provided by buffering and multiplexing parallel sequences of quantized data from respective stages of parallel delta-sigma modulation. The quantized data stream 208 also is provided to the deglitching system 202.

The deglitching system 202 is operative to derive an indication of the error (or glitch) that might occur because of transitioning between parallel stages of the network 206. The deglitching system 202 converts the computed error to an appropriate analog signal that can be subtracted from an analog signal produced by a DAC 210. As a result, the system 200 can provide a substantially error free analog output signal at 212. The deglitching system 202 can be implemented digitally such as by a combination of digital logic and/or computational processing (e.g., by a DSP). Alternatively, the deglitching system can be implemented using analog circuitry or a combination of analog and digital circuitry.

In the example of FIG. 6, the deglitching system 202 is an example of a digital implementation thereof, such as can be performed in an associated DSP. The system 202 includes a fast Fourier transform (FFT) 214 that converts the quantized data signal to a corresponding frequency domain representation 216. Those skilled in the art will understand appreciated various FFT algorithms that can be utilized.

A digital filter mask 218 processes the frequency domain representation 216 to derive an indication of the parallelization errors from the delta-sigma modulator network 206. The digital filter mask 218, for example, is configured to filter out the known (or desired) portions of the quantized data signal, including noise and data, so that the entire signal except the error is filtered. As a result of such filtering, the error 220 is provided to an inverse fast Fourier transform (IFFT) for converting the error back to a corresponding time domain representation thereof. It will be understood and appreciated that while the IFFT 222 may be a large circuit requiring substantial real estate, the incremental cost associated with this tends to be small because such structure can be implemented with low cost CMOS technology.

The time domain representation of the error 224 is provided to a DAC 226. The DAC 226 can have a much lower dynamic range (of the order of the glitch) than the DAC 210, such as by implementing it in CMOS or other low cost technology and implementing the DAC 210 with a high dynamic range (e.g., using SiGe or InP). The DAC 226 converts the time domain representation of the error 224 to a corresponding analog signal 228. The analog glitch signal 228 is then subtracted from the composite analog representation of the signal 230, which function is schematically illustrated by summer 232. By subtracting the analog error signal 228 from the analog composite signal 230, the summer 232 provides a substantially glitch free output signal 212.

Those skilled in the art will understand and appreciate that various alternative deglitching systems can be utilized in accordance with an aspect of the present invention. For example, instead of implementing a filter mask 218, a suitable look-up table can be preprogrammed to provide corresponding glitch signals as a function of the quantized data stream 208. Such a look-up table can be programmed based on empirical studies, theoretical calculations or simulations of the delta-sigma network 206. The resulting glitch data from the look-up table can be converted to an analog signal and in turn subtracted from the composite signal similarly to that described above.

FIG. 7 is an example of an alternative delta-sigma modulator DAC system 250 including a deglitching system 252 in accordance with an aspect of the present invention. In this example, the deglitching system 252 is configured to derive a cancellation signal for an associated glitch that can be subtracted from the actual signal to provide a substantially glitch-free output signal.

A DSP 254 provides a baseband signal 256 to a parallel delta-sigma modulator network 258 implemented in accordance with an aspect of the present invention. The delta-sigma modulator network 258 provides quantized data 260 to an associated DAC 262 that converts the quantized data stream to a corresponding analog signal 264. The analog signal 264 may include an error resulting from the parallelization of the delta-sigma modulator network 256.

The DSP 254 also provides a digital reference signal 266 corresponding to a wanted output signal to a DAC 268, which can have a lower dynamic range (of the order of the glitch to be cancelled) than the DAC 262. The reference signal 266 can be provided through a delay/inverter component (e.g., buffer) 270 that delays the reference signal to a delayed version thereof indicated at 272. The delay component 270 also can include an inverter to invert the wanted signal to enable desired signal cancellation. Alternatively, such inverter can be implemented at a different part of the deglitching system 252. The delay component 270 can be configured to approximate the processing time associated with the delta-sigma modulation and conversion by the network 258, for example. The DAC 268, in turn, provides a reference signal 274 that does not include errors associated with parallelization (e.g., it is a "clean" version of the wanted signal). The reference signal 274 is provided to an optional associated filter 276 to remove out-of-band signal content.

In the main signal path, the delta-sigma modulator network 258 provides the quantized output stream 260 of data read from each of the plural parallel stages to the associated high speed DAC 262, such as through appropriate multiplexing. The DAC 262 converts the quantized data 260 to the corresponding analog signal 264, which is provided to a corresponding filter 278 (e.g., bandpass filter). The filter 278 filters out-of-band portions of the signal and quantization noise to provide a filtered composite signal 280, which includes desired signal components plus parallelization error from the network 258.

A coupler (not shown) is operative to provide the composite signal (at reduced power) to a summer 282. The summer 282 subtracts the filtered reference signal 284 from the composite signal 280 to provide a corresponding error signal 286. The error signal corresponds to the unwanted portion of the output signal that might result from performing parallel stages of delta-sigma modulation in accordance with an aspect of the present invention. An amplifier 288 amplifies the error signal 286 to provide an amplified error signal 290.

Amplitude and phase control 292 can be implemented relative to the amplified error signal 290 to provide a corresponding error signal 294 that is substantially normalized and out-of phase with the output signal. The amplitude and phase control 292, for example, ensures that the error signal is appropriately inverted relative to the path and that the amplitude is normalized to an appropriate amplitude level to facilitate canceling the error from the composite filter signal 280. Optionally, the filtered composite signal 280 can be delayed via delay block 296, such as by buffering the signal, to help accommodate the deglitching process. A delayed composite signal 298 is, in turn, provided to an input of a summer or coupler 300, which is operative to subtract the error signal 294 from the delayed composite signal 298. As a result, a corresponding substantially error free output signal is provided at 302. Additionally, the cancellation process can be used to reduce or remove the quantization noise near the wanted signal (e.g., to the limit of the dynamic range of the cancellation path and the ability to properly phase invert the signal).

FIG. 8 is an example of a portion of a transmitter 320 that can be implemented using parallel delta-sigma modulation in accordance with an aspect of the present invention. A digital input signal 321 is provided to an input of a delta-sigma modulator network 322 having parallel stages according to an aspect of the present invention. The delta-sigma modulator network 322 (e.g., as shown and described in FIG. 2) provides a quantized output signal 324 to a corresponding DAC 326, such as at a coarser resolution and a higher sample rate as compared to the digital input signal.

In this example, the DAC 326 converts the quantized signal 324 directly to an analog signal 328 at a desired transmission frequency (e.g., UHF or microwave frequencies). By way of particular example, for GSM, the desired transmission frequency can be a spectrum (e.g., about 10 MHz) having a center frequency at about 940 MHz. It will be understood and appreciated that other transmission frequencies (e.g., in the MHz range or higher) can be efficiently and cost effectively provided in accordance with an aspect of the present invention.

The analog signal 328 is then filtered, such as with an analog bandpass filter 330, to remove out-of-band emissions and quantization noise. The filtered output 332 is then provided to a power amplifier 334 that amplifies the signal 332 to a desired level. The power amplifier 334 then feeds one or more antennas 336 that propagate the amplified signal through air or some other wireless medium (e.g., space).

As mentioned above, it will be appreciated that such direct-to-RF digital-to-analog conversion is facilitated by employing a parallel delta-sigma modulator network in conjunction with a high-speed DAC according to an aspect of the present invention. For example, the network 322 can be implemented using low speed, high yield technologies, such as including CMOS delta-sigma modulators, which can closely approximate a high speed, more expensive delta sigma modulator but at a significant cost reduction. This enables a high speed DAC (e.g., SiGe or InP operating in the 1–300 GHz range) to be utilized to convert the quantized data stream from the network directly to desired radio transmission frequencies without requiring additional analog frequency conversion.

FIG. 9 is another example of a portion of a transmit module 350 that can be implemented utilizing a delta-sigma modulator network 352 in accordance with an aspect of the present invention. The front end of the module 350 is similar to that shown and described with respect to FIG. 8. Briefly stated, a digital input signal 354 is provided to an input of the delta-sigma modulator network 352 (e.g., as shown and described in FIG. 2) that provides a quantized output signal 356. The network 352 provides the quantized output signal 356 to a corresponding DAC 358 that converts the signal to an analog signal 359 at a desired intermediate frequency (IF). A filter 360 removes out-of-band emissions and quantization noise, such as associated with the conversion and/or the delta-sigma modulation, to provide a filter signal 361 at the IF. The IF can be any desired frequency, such as in the MHz range (e.g., VHF or UHF), or GHz range (e.g., microwave/millimeter wave).

The IF signal 361 is provided to an upmixing system 362. The upmixing system 362 can include one or more stages of upconversion and mixing, as needed to upmix the signal to a desired carrier frequency. Because a delta-sigma modulator network 352 implemented in accordance with an aspect of the present invention can provide quantized data at a high data rate, most desired frequencies (e.g., in the upper MHz or GHz range) can be achieved through a single stage of upmixing. The upmixing system 362, in this example, includes a local oscillator 364 and mixer 366 that produce a signal 368 having a desired transmission frequency. In particular, the local oscillator 364 is utilized to provide a desired carrier frequency 370 at a desired transmission frequency. The mixer 366 produces the RF signal 368 by combining the IF signal 360 with the carrier signal 370 provided by the local oscillator 364.

A filter 372, in turn, optimizes the bandwidth and mitigates unwanted out-of-band emissions and quantization error, such as may result from the conversion processes associated with delta-sigma modulation as well as the upmixing. The filter 372 provides the filtered analog output signal 374 to an associated power amplifier 376. The power amplifier 376, in turn, provides an amplified signal to an associated antenna 378 for wireless transmission. Those skilled in the art will understand and appreciate various other types of filtering and up-conversion that can be utilized to provide a desired RF signal utilizing the parallel delta-sigma modulator and DAC arranged in accordance with an aspect of the present invention.

Figure 10:
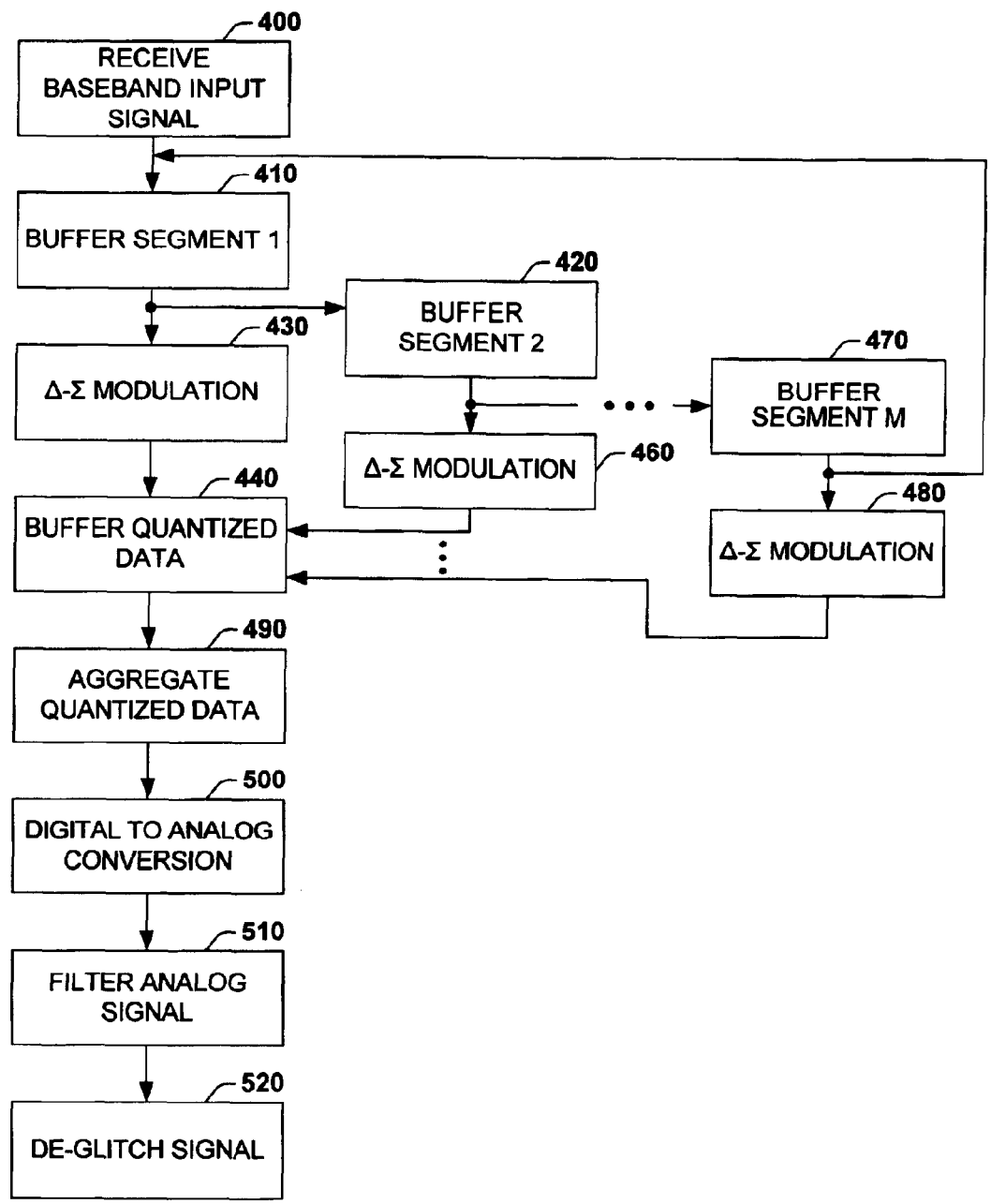
FIG. 10 is a flow diagram illustrating a conversion methodology in accordance with an aspect of the present invention.

In view of the examples shown and described above, a methodology for low noise amplification in accordance with the present invention will be better appreciated with reference to the flow diagrams of FIG. 10. While, for purposes of simplicity of explanation, the methodology is shown and described as executing serially, it is to be understood and appreciated that the present invention is not limited by the order shown, as some aspects may, in accordance with the present invention, occur in different orders and/or concurrently from that shown and described herein. Moreover, not all features shown or described may be needed to implement a methodology in accordance with the present invention. Additionally, such methodology can be implemented in hardware (e.g., one or more integrated circuits), software (e.g., running on a DSP or ASIC) or a combination of hardware and software.

The methodology begins at 400 in which a digital input signal is received. For example, a baseband modulator or digital signal processor can provide the input signal to the conversion system at an input sample rate. At 410, a first segment of the input signal is buffered (e.g., by switching or demultiplexing) a predetermined number of bits of the signal at the input sample rate. For example, the buffered segment can correspond to a burst of a GSM signal, although other segment sizes could be used as a matter of design choice and the wireless scheme being employed. After the first segment is buffered (at 410), a next segment of the input signal is sequentially buffered at 420. Substantially concurrently with the buffering of the second segment (at 420), at 430 another processing stage that includes recursive (e.g., IIR) filtering is implemented on the first buffered segment. For example, such recursive filtering can include delta-sigma modulation is performed on the first buffered segment. As is known in the art, the delta-sigma modulation includes noise shaping and quantization, which can be implemented in an IIR filter with a quantizer. The delta-sigma modulation at 430 results in quantized data that has a coarser resolution and, if an interpolator or digital upconverter is included, the output will be at a faster data rate. At 440, the quantized data representation of the first segment is buffered into appropriate memory.

At 460, which occurs sequentially after segment buffering (at 420), delta-sigma modulation is performed on the buffered second segment. This modulation, which can include IIR filtering alone or with quantization as well as other processing, also produces data that is also buffered at 440. Assuming that there are more than two parallel stages of delta-sigma modulation in the conversion process, in sequence after buffering the second segment (420), a next segment is buffered and further processed by performing recursive filtering, such as implemented as part of delta-sigma modulation, on that segment. Each of the data segments of the input signal are processed in parallel in a similar manner.

Finally, when the $M^{th}$ data segment of the input signal has been buffered at 470, the buffering process returns to buffer the M+1 segment of the input signal, which can be switched into the same buffer memory section into which the first segment was buffered at 410. The buffered $M^{th}$ segment is also delta-sigma modulated at 480. Thus, at least some or all of the M parallel stages of buffering and delta-sigma modulation can occur concurrently. In one implementation, separate buffers can be provided for each of the M stages for sequentially receiving buffered data from the input signal.

It is to be understood and appreciated that the delta-sigma modulation at 430, 460 and 480 can be implemented using low cost, low speed technology (e.g., CMOS). By employing low cost delta-sigma modulators in parallel stages, according to an aspect of the present invention, a high speed (and substantially more expensive) delta-sigma modulator can be closely approximated. It is also possible to synthesize a higher performance DSM with multiple parallel stages than any comparable single stage system. Higher performance characteristics include higher output frequency (including microwave), wider bandwidth, and/or higher dynamic range.

After delta-sigma modulation, as the quantized data is being buffered into appropriate memory, such quantized data can be aggregated at 490. Such aggregation can include multiplexing the quantized data from memory at a desired sample rate that is M times faster than the rate at which the quantized data is provided by each respective delta-sigma modulation stage. The aggregation (at 490) results in a quantized data stream. The quantized data stream can comprise multi-bit or single bit data.

At 500, corresponding digital-to-analog conversion is implemented on the bit stream provided by the aggregation (at 490). The digital-to-analog conversion can be performed by a high speed single bit DAC or, alternatively, a multi-bit DAC. It is to be understood that as an alternative to the digital-to-analog conversion implemented at 500, the quantized data stream provided at 490 could be processed digitally at 500. In this way, the methodology 400-490 provides an efficient implementation for high performance digital-to-digital conversion.

At 510, the analog signal is filtered, such as using a bandpass filter, to provide a corresponding analog signal in a desired frequency spectrum. Advantageously, the desired frequency spectrum can be provided directly at desired transmission frequencies (e.g., UHF or microwave frequencies), even where the delta-sigma modulation (at 430, 460, 480) is implemented using low speed, low cost technology such as CMOS. Alternatively, one or more stages of analog upconversion and mixing can be utilized to provide a desired transmission frequency.

Optionally, at 520, a signal can be deglitched by implementing a form of error correction to remove errors that occur as a result of transitioning between parallel stages of delta-sigma modulation. Such deglitching or error cancellation can be implemented digitally, in the analog domain or a combination thereof. Such deglitching, for example, can include deriving an indication of the glitch based on known system parameters or otherwise extracting the glitch from a resulting analog signal and, in turn, subtracting the glitch from the composite analog signal employing a feedforward-like technique. As a result, a substantially glitch or error-free signal can be provided at 520, such as if the resulting analog signal provided at 510 may be unacceptable for a given application.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A signal conversion system, comprising:
 a plurality of parallel stages, each of the parallel stages being operative to perform at least one of filtering, noise shaping and quantization on a respective sample of a digital input signal and provide a corresponding output signal at a rate that is functionally related to the number of parallel stages.

2. The system of claim 1, each of the parallel stages further comprising a delta-sigma modulator operative to perform the noise shaping and quantization and to provide the corresponding output signal for the respective parallel stage.

3. The system of claim 2, each of the delta-sigma modulators providing the corresponding output signal at 1/M a desired output sample rate, where M is the number of parallel stages.

4. The system of claim 3, the desired output sample rate being at least about 1 GHz.

5. A signal conversion system comprising:
 a plurality of parallel stages, each of the parallel stages being operative to perform at least one of filtering, noise shaping and quantization on a respective sample of a digital input signal and provide a corresponding output signal at a rate that is functionally related to the number of parallel stages,
 each of the parallel stages further comprising a delta-sigma modulator operative to perform the noise shaping and quantization and to provide the corresponding output signal for the respective parallel stage, and
 each of the delta-sigma modulators further comprises a complementary metal-oxide semiconductor (CMOS) delta-sigma modulator.

6. A signal conversion system, comprising:
 a plurality of parallel stages, each of the parallel stages being operative to perform at least one of filtering, noise shaping and quantization on a respective sample of a digital input signal and provide a corresponding output signal at a rate that is functionally related to the number of parallel stages;
 an aggregator that aggregates the output signals of the parallel stages and provides an aggregated signal at a desired output sample rate; and
 a digital-to-analog converter that converts the aggregated signal to a corresponding analog signal having a center frequency functionally related to the desired output sample rate.

7. A transmitter in combination with the system of claim 6, the combination comprising an antenna operative to propagate a wireless signal at a transmission frequency based on the corresponding analog signal.

8. The system of claim 6, the digital-to-analog converter providing the analog signal directly at a desired transmission frequency.

9. The system of claim 6, the digital-to-analog converter comprising of a one-bit digital-to-analog converter.

10. A signal conversion system, comprising:
 a plurality of parallel stages, each of the parallel stages being operative to perform at least one of filtering, noise shaping and quantization on a respective sample of a digital input signal and provide a corresponding output signal at a rate that is functionally related to the number of parallel stages;
 a switching system that sequentially separates the digital input signal into the respective samples of the digital input signal; and
 a memory having a memory section associated with each of the plurality of parallel stages, the switching system providing each of the respective samples to an associated memory section for processing by a delta-sigma modulator in an associated one of the parallel stages, such that the processing in at least some of the parallel stages occurs substantially concurrently.

11. A signal conversion system, comprising:
 a plurality of parallel stages, each of the parallel stages being operative to perform at least one of filtering, noise shaping and quantization on a respective sample of a digital input signal and provide a corresponding output signal at a rate that is functionally related to the number of parallel stages,
 the corresponding output signal having an error component associated with transitioning between the parallel stages, the system further comprising a cancellation system that derives an indication of the error component and employs the indication of the error component to substantially reduce the error component in the output signal.

12. The system of claim 1, each of the parallel stages provides the corresponding output signal at a rate that is functionally related to the number of parallel stages and greater than the rate of the input signal.

13. A conversion system, comprising:
 a separator operative to separate a modulated baseband input signal into plural sample signal segments;
 a plurality of conversion stages connected in parallel with each other, each of the conversion stages converts a respective one of the plural sample signal segments to a corresponding coarser representation thereof by performing noise shaping and quantization; and
 an aggregator that aggregates the coarser representations of the plurality of conversion stages and provides a corresponding aggregated output signal.

14. The system of claim 13, further comprising a digital-to-analog converter that converts the aggregated output signal to a corresponding analog signal.

15. The system of claim 14, the digital-to-analog converter further comprising a one-bit digital-to-analog converter that operates at a sample rate sufficient to convert the aggregated output signal to the corresponding analog signal directly at a desired transmission frequency.

16. The system of claim 14, the corresponding analog signal having an error component associated with transitioning between the parallel conversion stages, the system further comprising a cancellation system that derives an indication of the error component and employs the indication of the error component to substantially reduce the error component in the corresponding analog signal provided.

17. A transmitter in combination with the system of claim 14, the combination comprising an antenna operative to propagate a wireless signal based on the corresponding analog signal.

18. The combination of claim 17, the digital-to-analog converter converting the aggregated output signal to the corresponding analog signal directly at a radio transmission frequency.

19. The system of claim 13, at least two of the parallel conversion stages further comprising a delta-sigma modulator, each being operative to perform the noise shaping and quantization and to provide a corresponding quantized output signal, the aggregator aggregating the quantized output signals of the at least two delta-sigma modulators.

20. The system of claim 19, each of the delta-sigma modulators providing the corresponding quantized output signal at 1/M a desired output sample rate, where M is the number of parallel delta-sigma modulators.

21. The system of claim 19, wherein each of the delta-sigma modulators further comprises a complementary metal-oxide semiconductor (CMOS) delta-sigma modulator.

22. The system of claim 19, further comprising a digital-to-analog converter that converts the aggregated output signal to a corresponding analog signal.

23. The system of claim 22, the digital-to-analog converter being fabricated from a material that is different from that of the delta-sigma modulators to enable the digital-to-analog converter to operate at a desired output sample rate that is substantially greater than that of the delta-sigma modulators.

24. The system of claim 22, the digital-to-analog converter providing the corresponding analog signal directly at a transmission frequency functionally related to the desired output sample rate.

25. The system of claim 24, the desired output sample rate being at least 1 GHz.

26. The system of claim 13, the separator further comprising:
    a switching system that sequentially separates the digital input signal into the respective samples of the digital input signal; and
    memory having respective memory sections associated with each of the plurality of parallel stages, the switching system providing each of the samples to a respective memory section for processing by an associated one of the parallel stages, such that the processing in at least some of the parallel stages occurs concurrently.

27. A conversion system, comprising:
    means for separating a digital input signal into plural sample signal segments;
    parallel means for performing noise shaping and quantization on each of the plural sample signal segments to provide a corresponding quantized representation of each of the plural sample segments thereof; and
    means for aggregating the quantized representations from the parallel means and for providing a corresponding aggregated output signal at a desired output sample rate.

28. The system of claim 27, further comprising means for converting the aggregated output signal directly to an analog signal that is centered at about a desired radio transmission frequency.

29. A method for converting a digital input signal to a different form, the method comprising:
    separating a digital input signal into plural sample signal segments;
    performing noise shaping and quantization on each of the plural sample signal segments to provide a corresponding quantized representation of each of the plural sample segments thereof, the noise shaping and quantization for different ones of the plural sample signals being performed in parallel; and
    aggregating the quantized representations from the parallel means to provide a corresponding aggregated output signal at a desired output sample rate.

30. The method of claim 29, the noise shaping and quantization for different ones of the plural sample signals being performed by delta-sigma modulation.

31. The method of claim 29, further comprising converting the aggregated output signal to an analog signal that is centered at about a desired radio transmission frequency.

* * * * *